(12) United States Patent
Holmes

(10) Patent No.: US 7,637,415 B2
(45) Date of Patent: Dec. 29, 2009

(54) METHODS AND APPARATUS FOR ASSEMBLING A PRINTED CIRCUIT BOARD

(75) Inventor: John Steven Holmes, Sellersburg, IN (US)

(73) Assignee: General Electric Company, Schenectady, NY (US)

( * ) Notice: Subject to any disclaimer, the term of this patent is extended or adjusted under 35 U.S.C. 154(b) by 353 days.

(21) Appl. No.: 11/263,306

(22) Filed: Oct. 31, 2005

(65) Prior Publication Data

US 2007/0095879 A1    May 3, 2007

(51) Int. Cl.
 *H05K 3/34* (2006.01)
(52) U.S. Cl. .............. 228/260; 228/37; 228/180.1; 29/841
(58) Field of Classification Search .......... 228/180.1, 228/37, 260; 29/840–841
See application file for complete search history.

(56) References Cited

U.S. PATENT DOCUMENTS

| | | | |
|---|---|---|---|
| 3,958,740 A | 5/1976 | Dixon | |
| 4,345,371 A | 8/1982 | Ohsawa et al. | |
| 4,398,660 A | 8/1983 | Pampalone et al. | |
| 4,566,624 A * | 1/1986 | Comerford | 228/180.1 |
| 4,728,022 A | 3/1988 | Jamison | |
| 4,761,881 A * | 8/1988 | Bora et al. | 29/840 |
| 5,085,364 A | 2/1992 | Ishikawa et al. | |
| 5,102,030 A | 4/1992 | Tamashima et al. | |
| 5,155,904 A * | 10/1992 | Majd | 29/837 |
| 5,169,056 A | 12/1992 | Reele et al. | |
| 6,049,976 A * | 4/2000 | Khandros | 29/843 |
| 6,202,916 B1 * | 3/2001 | Updike et al. | 228/180.1 |
| 6,202,917 B1 | 3/2001 | Weaver et al. | |
| 6,688,511 B2 * | 2/2004 | Hildenbrand et al. | 228/102 |
| 6,698,084 B2 | 3/2004 | Uchikoba | |
| 6,722,028 B2 | 4/2004 | Nakamura | |
| 2003/0121953 A1 | 7/2003 | Wong et al. | |
| 2004/0256734 A1 * | 12/2004 | Farnworth et al. | 257/777 |
| 2005/0230457 A1 * | 10/2005 | Kay et al. | 228/260 |

* cited by examiner

*Primary Examiner*—Kuang Y Lin
*Assistant Examiner*—Devang Patel
(74) *Attorney, Agent, or Firm*—George L. Rideout, Esq.; Armstrong Teasdale LLP

(57) ABSTRACT

A method for manufacturing a printed circuit board includes providing a board including a plurality of electrical traces, a first surface, and a second surface opposite the first surface. The method further includes providing at least one surface mount component having a plurality of electrical terminals. The method also includes applying an adhesive on the first surface of the board, and adhering the surface mounting component to the first surface. The method also includes wave soldering the surface mount component on the first surface to the board to encapsulate at least a portion of the electrical terminals of the surface mount component with a lead-free solder.

19 Claims, 3 Drawing Sheets

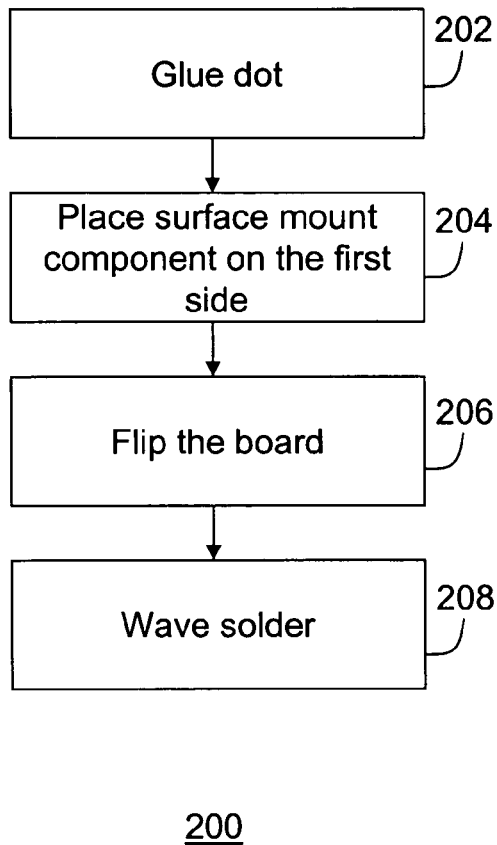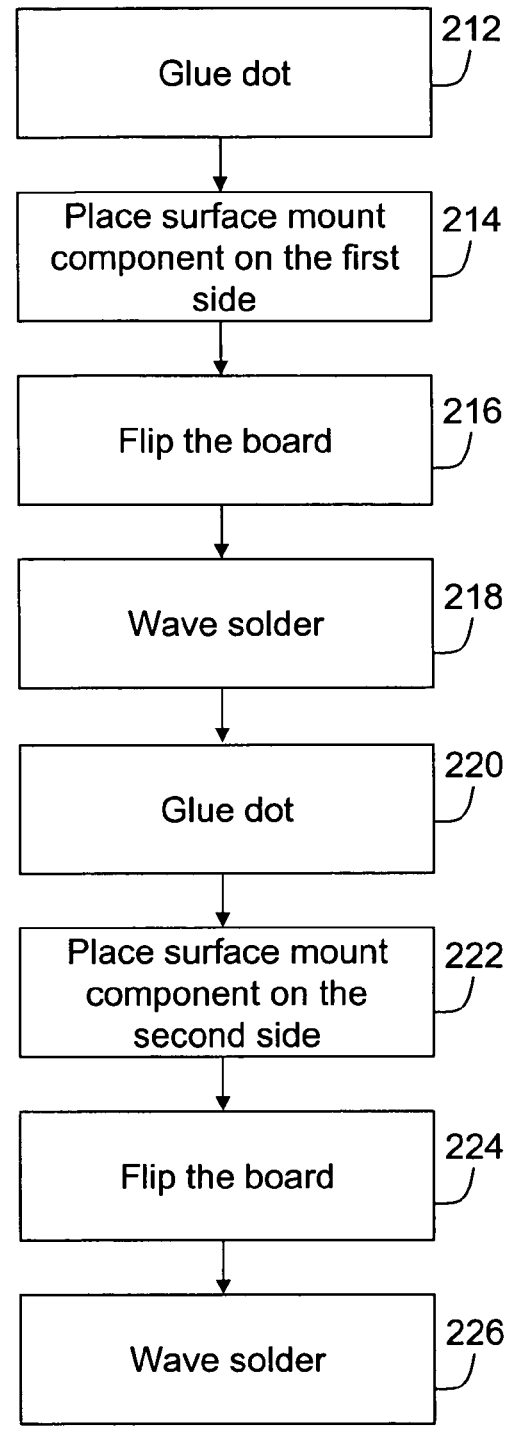
Figure 2
Figure 3

230

250

METHODS AND APPARATUS FOR ASSEMBLING A PRINTED CIRCUIT BOARD

BACKGROUND OF THE INVENTION

This invention relates generally to printed circuit boards, and, more particularly, to methods and apparatus for soldering printed circuit boards.

Tin or tin alloy deposits have been widely used in fabricating electronic circuits, electronic devices and electrical connectors because of the benefits that such deposits provide. For example, tin and tin alloy deposits protect the components from corrosion, provide a chemically stable surface for soldering and maintain good surface electrical contact.

At least some known electrical components, such as for example, surface mount components have a plurality of conductive terminals with tin or tin alloy deposit thereon. The terminals of the surface mount components are then placed on a printed circuit board, and are soldered onto the printed circuit board by a known reflow soldering process. However, most portion of the terminals are still exposed in the air after the reflow soldering process, and the tin or tin alloy deposit on the exposed portion have a tendency of whisker shaped formation growing from the outer surface thereof, known as "tin whisker". Such tin whiskers considerably decrease the operation reliability of the electrical components, and increase the maintenance cost of the equipment utilizing such electrical components. At least some known producers store the wave soldered components for 3000 to 4000 hours for observing the tin whisker situation, which is obviously undesired by the producers.

BRIEF DESCRIPTION OF THE INVENTION

In one aspect, a method for manufacturing a printed circuit board is provided. The method includes providing a board including a plurality of electrical traces, a first surface, and a second surface opposite the first surface, and providing at least one surface mount component having a plurality of electrical terminals. The method also includes applying an adhesive on the first surface of the board, and adhering the surface mounting component to the first surface. The method also includes wave soldering the surface mount component on the first surface to the board to encapsulate at least a portion of the electrical terminals of the surface mount component with a lead-free solder.

In another aspect, a method for providing a printed circuit board is provided. The method includes providing a board including a plurality of electrical traces, a first surface, and a second surface opposite the first surface, and providing at least one surface mount component having a plurality of electrical terminals. The method also includes applying an adhesive on the first surface of the board, and adhering the surface mount component to the first surface. The method also includes encapsulating at least a portion of the electrical terminals with a lead-free solder without utilizing reflow soldering.

In still another aspect, a method for providing a printed circuit board is provided. The method includes providing a board including a plurality of electrical traces, a first surface, and a second surface opposite to the first surface, and providing a plurality of surface mount components, each surface mount component having a plurality of electrical terminals. The method also includes adhering at least one of the surface mount components to the first surface, and wave soldering the surface mount component on the first surface to the board. The method also includes adhering at least one of the surface mount components to the second surface after wave soldering the surface mount component on the first surface, and wave soldering the surface mount component on the second surface to the board.

In still another aspect, a printed circuit board is provided. The printed circuit board includes a board including a plurality of electrical traces, a first surface, and a second surface opposite the first surface, at least one first surface mount component having a plurality of electrical terminals, the first surface mount component wave soldered on the first surface of the board, and a lead-free solder encapsulating at least a portion of the electrical terminals of the first surface mount component.

BRIEF DESCRIPTION OF THE DRAWINGS

FIG. 2 is a flow chart of an exemplary method for fabricating a printed circuit board.

FIG. 3 is a flow chart of an alternative method for fabricating a printed circuit board.

DETAILED DESCRIPTION OF THE INVENTION

Figure 1:
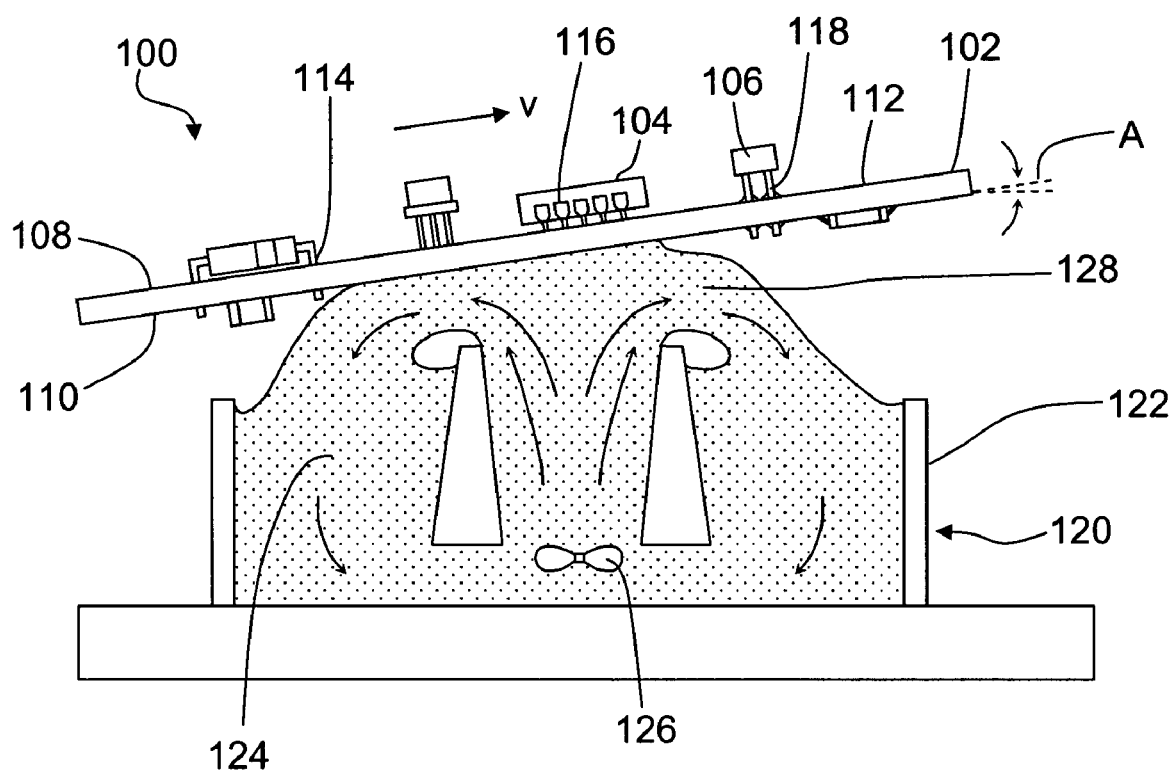
FIG. 1 is a schematic view of an exemplary printed circuit board on an exemplary wave soldering apparatus.

FIG. 1 illustrates an exemplary printed circuit board (PCB) 100 applicable to the present invention. PCB 100 includes a board 102, a plurality of surface mount electrical components 104 mounted on board 102, and a plurality of through-hole mount electrical components 106 mounted on board 102.

In the exemplary embodiment, board 102 includes a first surface 108 and a second surface 110 opposite first surface 108 for mounting electrical components 104, 106 thereon. Board 102 also includes a plurality of electrical traces 112 defined on first and second surfaces 108, 110, and a plurality of through holes 114 defined therethrough for mounting through-hole mount components 106.

In the exemplary embodiment, each surface mount component 104 includes a plurality of electrical terminals 116 for being positioned on or adjacent board 102. Each through-hole mount component 106 also includes a plurality of electrical terminals 118 for inserting into through holes 114 of board 102. As such, terminals 116, 118 may be soldered onto board 102, and components 104, 106 may be electrically connected with electrical traces 112 of board 102 to form an electrical circuit and perform a desired function of the corresponding component. In an exemplary embodiment, terminals 116, 118 of electrical components 104, 106 are coated with tin.

As illustrated in FIG. 1, PCB 100 is a dual sided hybrid board that includes surface mount components 104 on both surfaces 108, 110 of board 102 and through-hole mount components 106 mounted thereon. However, it is contemplated that the present invention is applicable, not only to dual sided hybrid PCB, such as PCB 100 shown in FIG. 1, but to other forms of PCBs as well, such as, but not limited to, PCBs without through-hole components mounted thereon, and PCBs with electrical components mounted on only one surface thereof. Therefore, PCB 100 shown in FIG. 1 is provided by way of illustration rather than limitation, and accordingly there is no intention to limit application of the present invention to any particular PCBs, such as PCB 100.

Wave soldering apparatus 120 is an exemplary apparatus typically employed to wave solder electrical components 104, 106 onto board 102. Wave soldering apparatus 120 includes a solder reservoir 122 containing molten solder 124 therein, and a pump 126 positioned at a lower portion of solder reservoir 122. Pump 126 may be energized to pump the molten solder upward to produce a wave 128 of molten solder 124. However, it is contemplated that the wave soldering apparatus having two solder waves may also be employed to wave solder PCB 100 in alternative embodiments. The detailed structure and operation of wave soldering apparatus 120 are believed to be within the purview of those in the art and generally beyond the scope of the present invention, so further discussion thereof is omitted.

FIG. 2 is a flow chart of an exemplary method 200 for fabricating a PCB which only has surface mount component 104 (shown in FIG. 1) on first surface 108 (shown in FIG. 1) and has no through-hole mount components 106 (shown in FIG. 1) thereon.

An adhesive is applied 202 to board 102 (shown in FIG. 1) on the predetermined positions of first surface 108 (shown in FIG. 1) before positioning any electrical component thereon. Surface mount components 104 (shown in FIG. 1) are then positioned 204 on the predetermined positions of first surface 108, such that surface mount components 104 are adhered onto first surface 108. Board 102 is flipped 206 over to position first surface 108 facing down, and then terminals 116 (shown in FIG. 1) are wave soldered 208 to board 102.

Specifically, during wave soldering step 208, board 102 (shown in FIG. 1) passes molten solder wave 128 (shown in FIG. 1) of wave soldering apparatus 120 (shown in FIG. 1) at an acute angle A (shown in FIG. 1) with respect to a horizontal plane, and first surface 108 facing down contacts molten solder wave 128. More specifically, angle A is approximately between 4 and 12 degrees, such as for example, approximately 7 degrees. In the exemplary embodiment, wave 128 is formed by molten lead-free solder 124 (shown in FIG. 1), and terminals 116 (shown in FIG. 1) on first surface 108 (shown in FIG. 1) immerse into molten lead-free solder 124 during wave soldering step 208. As such, a PCB with surface mount components 104 (shown in FIG. 1) soldered on first surface 108 is provided, and substantially all of terminals 116 of surface mount components 104 are encapsulated by lead-free solder 124.

FIG. 3 is a flow chart of an alternative method 210 for fabricating a PCB which has surface mount component 104 (shown in FIG. 1) on first and second surfaces 108, 110 (shown in FIG. 1) and has no through-hole mount components 106 (shown in FIG. 1) thereon.

Surface mount components 104 (shown in FIG. 1) are soldered to first surface 108 (shown in FIG. 1) of board 102 (shown in FIG. 1) in a similar manner as method 200 (shown in FIG. 2). An adhesive is applied 212 to board 102 on first surface 108, surface mount components 104 are placed 214 on and adhered to first surface 108, board 102 is then flipped 216 over, and terminals 116 (shown in FIG. 1) of surface mount component 104 on first surface 108 are wave soldered 218 to board 102.

Surface mount components 104 (shown in FIG. 1) are then soldered to second surface 110 (shown in FIG. 1) of board 102 (shown in FIG. 1) in a similar manner as method 200 (shown in FIG. 2). An adhesive is applied 220 to board 102 on second surface 110 after surface mount components 104 on first surface 108 are wave soldered, and surface mount components 104 are placed 222 on and adhered to second surface 110 of board 102. Board 102 is then flipped 224 over to position second surface 110 facing down, and terminals 116 (shown in FIG. 1) of surface mount component 104 on second surface 110 are wave soldered 226 to board 102. It is contemplated that surface mount component 104 may be wave soldered in a similar manner as wave soldering step 208 (shown in FIG. 2) described above. As such, a PCB with surface mount components 104 soldered both on first and second surfaces 108, 110 is provided, and substantially all of terminals 116 of surface mount components 104 are encapsulated by lead-free solder 124 (shown in FIG. 1).

Figure 4:
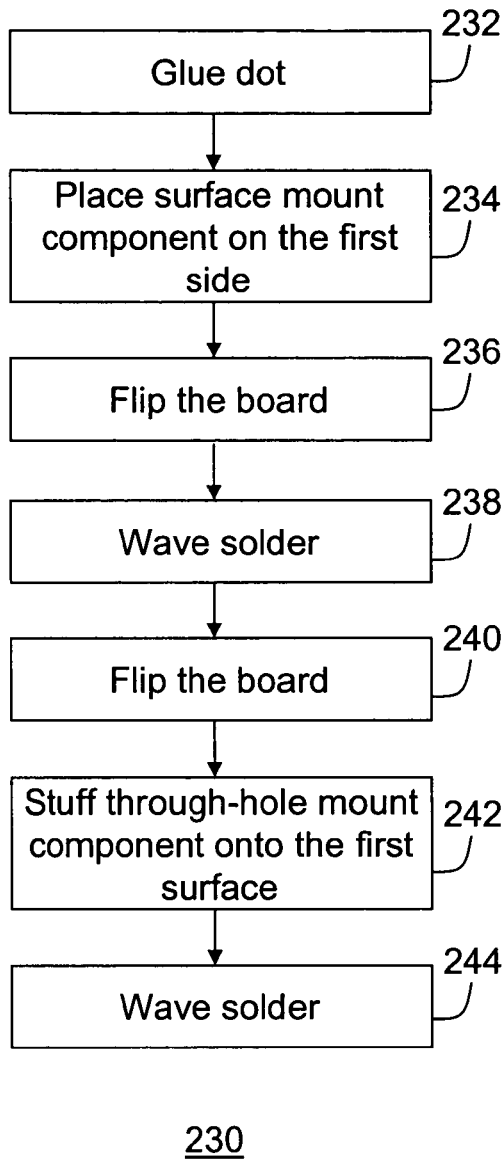
FIG. 4 is a flow chart of still an alternative method for fabricating a printed circuit board.

FIG. 4 is a flow chart of an alternative method 230 for fabricating a PCB which has both surface mount components 104 (shown in FIG. 1) and through-hole mount components 106 (shown in FIG. 1) on first surface 108 (shown in FIG. 1).

Surface mount components 104 (shown in FIG. 1) are soldered to first surface 108 (shown in FIG. 1) of board 102 (shown in FIG. 1) in a similar manner as method 200 (shown in FIG. 2). An adhesive is applied 232 to board 102 on first surface 108, surface mount components 104 are placed 234 on and adhered to first surface 108, board 102 is then flipped 236 over, and terminals 116 (shown in FIG. 1) of surface mount component 104 on first surface 108 are wave soldered 238 to board 102 in a similar manner as wave soldering step 208 (shown in FIG. 2).

Board 102 (shown in FIG. 1) is then flipped 240 over to position first surface 108 (shown in FIG. 1) facing upward, and through-hole mount component 106 is mounted 242 onto first surface 108 with terminals 118 (shown in FIG. 1) being inserted into through holes 114 (shown in FIG. 1) of board 102. The portion of terminals 118 extending below second surface 110 (shown in FIG. 1) is then wave soldered 244 to board 102 in a similar manner as wave soldering step 208 (shown in FIG. 2). As such, a PCB with both surface mount components 104 and through-hole mount components 106 soldered on first surface 108 is provided, and substantially all of terminals 116 of surface mount components 104 and a lower portion of terminals 118 of through-hole mount components 106 are encapsulated by lead-free solder 124 (shown in FIG. 1).

Figure 5:
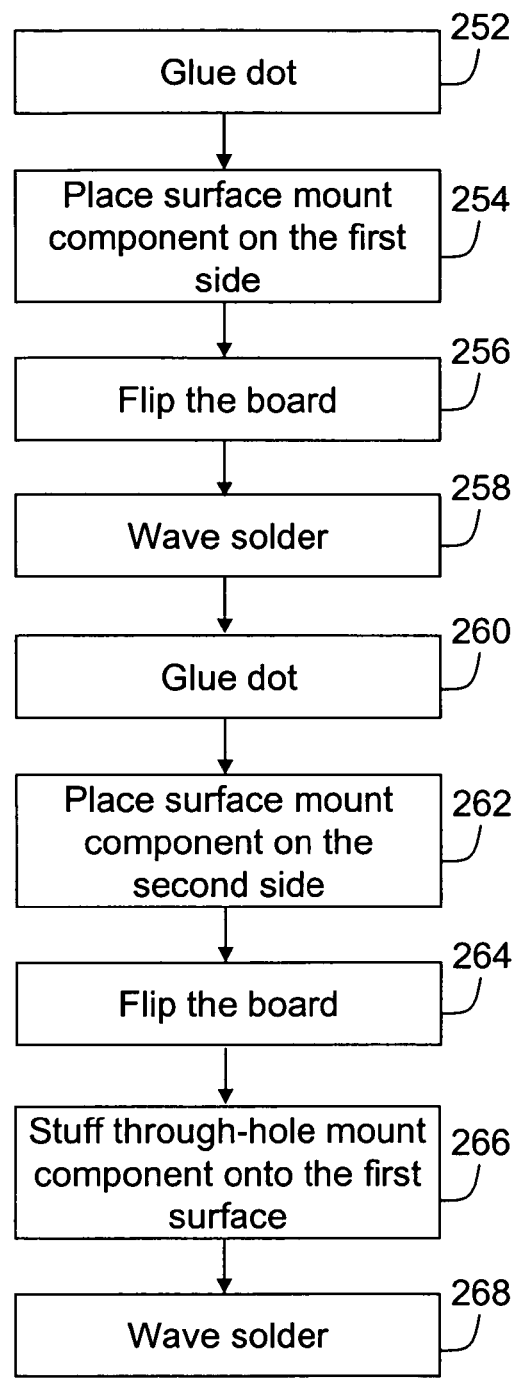
FIG. 5 is a flow chart of still an alternative method for fabricating a printed circuit board.

FIG. 5 is a flow chart of an alternative method 250 for fabricating PCB 100 shown in FIG. 1 which has surface mount components 104 (shown in FIG. 1) on both first and second surfaces 108, 110 (shown in FIG. 1) and through-hole mount components 106 (shown in FIG. 1) on first surface 108.

Surface mount components 104 (shown in FIG. 1) are soldered to first surface 108 (shown in FIG. 1) of board 102 (shown in FIG. 1) in a similar manner as method 200 (shown in FIG. 2). An adhesive is applied 252 to board 102 on first surface 108, surface mount components 104 are placed 254 on and adhered to first surface 108, board 102 is then flipped 256 over, and terminals 116 (shown in FIG. 1) of surface mount component 104 on first surface 108 are wave soldered 258 to board 102 in a similar manner as wave soldering step 208 (shown in FIG. 2).

An adhesive is applied 260 to board 102 (shown in FIG. 1) on second surface 110 (shown in FIG. 1) after surface mount component 104 (shown in FIG. 1) on first surface 108 (shown in FIG. 1) are wave soldered, and surface mount components 104 are placed 262 on and adhered to second surface 108 of board 102. Board 102 is then flipped 264 over to position second surface 110 facing down, and through-hole mount component 106 is mounted 266 onto first surface 108 with terminals 118 (shown in FIG. 1) extending through board 102. Terminals 116 (shown in FIG. 1) of surface mount component 104 on second surface 110 and terminals 118 extending below second surface 110 are wave soldered 268 to board 102 in a similar manner as wave soldering step 208 (shown in FIG. 2). As such, a PCB with surface mount components 104 soldered both on first and second surfaces 108, 110 and through-hole mount components 106 on first surface 108 is provided, and substantially all of terminals 116 and a lower portion of terminals 118 are encapsulated by lead-free solder 124 (shown in FIG. 1).

In an exemplary embodiment, in fabricating methods 200, 210, 230, and 250 (shown in FIGS. 2-5), board 102 is preheated to a predetermined temperature before being wave soldered, which facilitates obtaining a better soldering result. In still an exemplary embodiment, board 102 is annealed after being wave soldered, which facilitates reducing the tin whisker tendency of the wave soldered components.

The electrical components are soldered to the board by a wave soldering process instead of a reflow soldering process, and the tin coated terminals of the surface mount components are substantially encapsulated by a lead-free solder. As such, tin whisker tendency of the terminals is reduced by a single soldering process, and the operation reliability of the electrical components is improved.

While the invention has been described in terms of various specific embodiments, those skilled in the art will recognize that the invention can be practiced with modification within the spirit and scope of the claims.

What is claimed is:

1. A method for manufacturing a printed circuit board said method comprising:
   providing a board including a plurality of electrical traces, a first surface, and a second surface opposite the first surface;
   providing a plurality of surface mount components each comprising a plurality of electrical terminals;
   applying an adhesive on a portion of the first surface of the board and adhering a first surface mount component to the first surface;
   wave soldering the first surface of the board to mount the first surface mount component on the first surface, at least a portion of the electrical terminals of the first surface mount component encapsulated with a lead-free solder, and a first acute angle defined between the first surface of the board and a molten solder wave during said wave soldering, wherein the first acute angle is between about 4 degrees and about 12 degrees;
   applying an adhesive on a portion of the second surface of the board and adhering a second surface mount component to the second surface, after wave soldering the first surface of the board; and
   wave soldering the second side of the board to mount the second surface mount component on the second surface, at least a portion of the electrical terminals of the second surface mount component encapsulated with a lead-free solder, and a second acute angle defined between the second surface of the board and the molten solder wave during said wave soldering the second surface, wherein the second acute angle is between about 4 degrees and about 12 degrees.

2. A method in accordance with claim 1 further comprising flipping the board over after the first surface mount component is adhered to the first surface and before the first surface is wave soldered.

3. A method in accordance with claim 1 wherein said providing a plurality of surface mount components comprises providing at least one surface mount component having a plurality of electrical terminals comprising tin.

4. A method in accordance with claim 1 further comprising flipping the board after the second surface mount component is adhered to the second surface.

5. A method in accordance with claim 1 further comprising annealing the board after wave soldering the second surface mount component.

6. A method of assembling a printed circuit board, said method comprising:
   providing a board including a plurality of electrical traces, a first surface, and a second surface opposite the first surface;
   providing at least two surface mount components having a plurality of electrical terminals;
   mounting a first surface mount component of the at least two surface mount components to the first surface of the board by adhering the first surface mount component to the first surface;
   encapsulating at least a portion of the electrical terminals of the first surface mount component with a lead-free solder without utilizing a reflow soldering process, said encapsulating comprising wave soldering the first surface of the board such that a first acute angle is defined between the first surface of the board and a molten solder wave, the first acute angle between about 4 degrees and about 12 degrees;
   mounting a second surface mount component of the at least two surface mount components to the second surface of the board by adhering the second surface mount component to the second surface, after encapsulating at least a portion of the electrical terminals of the first surface mount component; and
   encapsulating at least a portion of the electrical terminals of the second surface mount component with a lead-free solder without utilizing the reflow soldering process, said encapsulating comprising wave soldering the second surface such that a second acute angle is defined between the second surface of the board and the molten solder wave, the second acute angle between about 4 degrees and about 12 degrees.

7. A method in accordance with claim 6 further comprising flipping the board over after the first surface mount component is mounted to the first surface and before the first surface mount component is encapsulated with the lead-free solder.

8. A method in accordance with claim 6 further comprising mounting at least one through-hole mount component onto the first surface of the board after encapsulating at least a portion of the electrical terminals of the first surface mount component.

9. A method in accordance with claim 8 further comprising encapsulating at least a portion of the at least one through-hole mount component without utilizing the reflow soldering process, said encapsulating performed using said wave soldering of the second surface.

10. A method in accordance with claim 8 further comprising flipping the board before the at least one through-hole mount component is mounted onto the first surface of the board.

11. A method in accordance with claim 8 further comprising simultaneously soldering the through-hole mount component and the second surface mount component to the board.

12. A method in accordance with claim 6 wherein said providing at least two surface mount components comprises providing at least one surface mount component having a plurality of electrical terminals comprising tin, the tin at least partially encapsulated by said lead-free solder.

13. A method in accordance with claim 6 further comprising annealing the board.

14. A method of fabricating a printed circuit board assembly, said method comprising:
   providing a board including a plurality of electrical traces, a first surface, and a second surface opposite to the first surface;

providing a plurality of surface mount components, each surface mount component including a plurality of electrical terminals;

adhering a first surface mount component of the plurality of surface mount components to the first surface;

wave soldering the first surface of the board to mount the first surface mount component on the first surface, a first acute angle formed between the first surface of the board and a molten solder wave during said wave soldering, the first acute angle between about 4 degrees and about 12 degrees;

adhering a second surface mount component of the plurality of surface mount components to the second surface of the board after wave soldering the first surface of the board; and wave soldering the second surface mount component on the second surface to the board, a second acute angle formed between the second surface of the board and the molten solder wave, the second acute angle between about 4 degrees and about 12 degrees.

15. A method in accordance with claim 14 wherein wave soldering the first surface mount component on the first surface further comprises encapsulating the plurality of electrical terminals of the first surface mount component with a lead-free solder.

16. A method in accordance with claim 14 further comprising preheating the board before wave soldering the first surface mount component on the first surface.

17. A method in accordance with claim 14 further comprising flipping the board before wave soldering the first surface mount component on the first surface.

18. A method in accordance with claim 14 further comprising mounting at least one through-hole mount component onto the first surface of the board after wave soldering the first surface mount component to the first surface by inserting an electrical terminal of the at least one through-hole mount component through the board from the first surface of the board toward the second surface of the board.

19. A method in accordance with claim 18 wherein wave soldering the second surface mount component on the second surface comprises wave soldering the through-hole mount component to the board.

* * * * *